United States Patent

Alexander et al.

[11] Patent Number: 5,936,469
[45] Date of Patent: Aug. 10, 1999

[54] AMPLIFIER WITH INPUT REFERRED COMMON-MODE ADJUSTMENT

[75] Inventors: Daniel D. Alexander, Gilbert; David J. Anderson, Scottsdale, both of Ariz.

[73] Assignee: Motorola, Inc., Schaumburg, Ill.

[21] Appl. No.: 08/905,524

[22] Filed: Aug. 4, 1997

[51] Int. Cl.[6] .................................................. H03F 3/45
[52] U.S. Cl. .......................................... 330/258; 330/253
[58] Field of Search .................................... 330/258, 261, 330/260, 253

[56] References Cited

U.S. PATENT DOCUMENTS

| | | | |
|---|---|---|---|
| 4,568,885 | 2/1986 | McKenzie et al. | 330/253 |
| 4,573,020 | 2/1986 | Whatley | 330/258 |
| 5,216,380 | 6/1993 | Carbou | 330/253 |
| 5,319,316 | 6/1994 | Fensch | 330/258 |
| 5,465,072 | 11/1995 | Atarodi | 330/258 |
| 5,493,246 | 2/1996 | Anderson | 327/382 |
| 5,631,607 | 5/1997 | Huijsing et al. | 330/253 |
| 5,691,664 | 11/1997 | Anderson et al. | 327/565 |
| 5,729,178 | 3/1998 | Park et al. | 330/258 |

*Primary Examiner*—Robert Pascal
*Assistant Examiner*—Khanh Van Nguyen
*Attorney, Agent, or Firm*—Anthony M. Martinez; Robert D. Atkins

[57] ABSTRACT

A circuit and method control the common-mode potential at an output (17, 18) of a fully differential amplifier (32) by feeding forward a common-mode correction signal through the amplifier. An input signal ($V_{IN+}-V_{IN-}$) is amplified in the amplifier to produce a differential output signal ($V_{O-}-V_{O+}$) at the output. A common potential of the differential inputs (37, 38) of the amplifier is sensed with a transistor (54, 56) biased to a reference voltage ($V_{CM}$) and amplified through the amplifier to produce a common-mode correction signal to offset a common-mode component of the differential output signal. A feedback circuit (33–36) is used to develop the common potential from the common-mode component.

23 Claims, 2 Drawing Sheets

AMPLIFIER WITH INPUT REFERRED COMMON-MODE ADJUSTMENT

BACKGROUND OF THE INVENTION

The present invention relates in general to integrated circuits and, more particularly, to amplifiers in programmable analog arrays.

Programmable analog arrays are integrated circuits that include a plurality of programmable analog cells for performing analog operations such as amplifying, filtering, etc., on analog signals. The analog signals are transferred among the programmable analog cells on interconnect paths formed in routing channels between adjacent cells.

Many programmable analog functions are executed by operational amplifiers controlled by feedback circuits that include switchable passive components such as resistors and capacitors whose ratios determine the operation of the amplifiers. Each passive component is coupled in series with a transmission gate or other analog switching device controlled by data stored in a memory for coupling the component to the amplifier in a desired configuration.

When the passive components are capacitors, the amplifiers often are clocked to operate the capacitors as functional equivalents of resistors. In order to provide maximum functionality, the amplifiers are designed to operate over a clock frequency range from a few hertz up to at least four megahertz to have a high frequency capability yet be stable under low frequency conditions.

Typically, the amplifiers are configured to be fully differential in order to increase noise immunity and minimize noise coupling to other circuits. To avoid unnecessarily reducing the dynamic range of the amplifier, control must be asserted over common-mode voltage levels. Prior art amplifiers control the output common-mode voltage by developing the common-mode component of the output signal for comparing to a reference voltage to produce a common-mode correction signal. The correction signal is amplified and fed back to an adjustment node input of the amplifier to adjust the common-mode component. A disadvantage of prior art amplifiers is the extra feedback amplifier, which introduces a phase shift in the feedback path that can increase signal settling time and makes the loop difficult to stabilize and results in restrictions on the allowable range of operating conditions. The feedback amplifiers have the further disadvantage of occupying a large die area and increasing power consumption.

Hence, a circuit is needed for controlling the common-mode voltage of an amplifier which is stable over a broad range of operating conditions and operates at a high speed. It would be a benefit if the circuit reduced power consumption and die area.

DETAILED DESCRIPTION OF THE DRAWINGS

Figure 1:
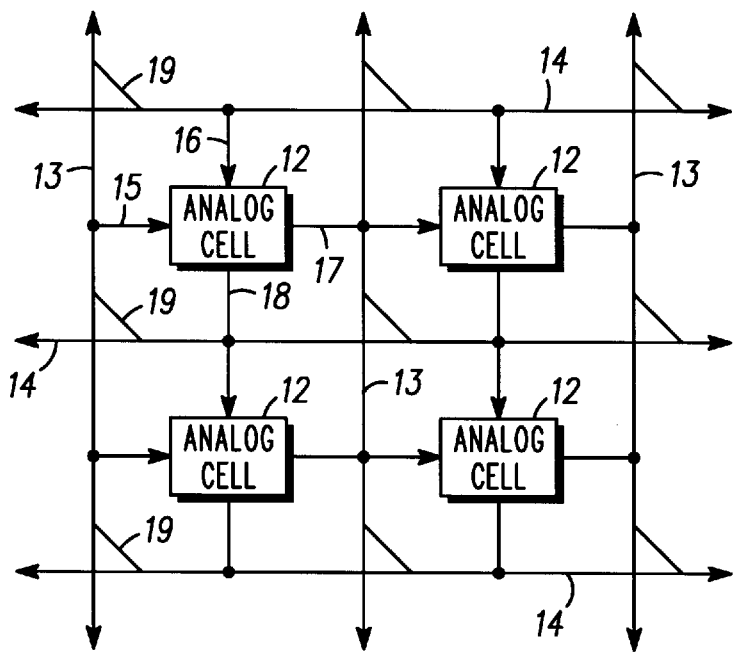
FIG. 1 is a block diagram of a programmable analog array.

FIG. 1 is a block diagram of a programmable analog array 10 in an integrated circuit configuration. Analog array 10 includes a plurality of programmable analog cells 12 arranged along a plurality of interconnect channels that form a switching network which includes bus lines 13 and 14 for routing analog signals. Input and output signals are transferred between analog cells 12 and buses 13 and 14 by means of analog switching devices such as transmission gates through which analog signals can be transferred with little or no distortion. In one embodiment, input signals are received on input terminals 15 and 16 and output signals are produced on output terminals 17 and 18. Input and output terminals 15–18 are connected to bus lines 13 and 14 with analog switching devices in analog cell 12. Signal routing between bus 13 and bus 14 is provided by switching devices 19.

The operating characteristics of a particular analog cell 12 are determined by switching devices within the cell which interconnect cell components to produce a desired circuit configuration. Control over the switching devices is provided by binary control signals that may be stored in a memory such as random access memory (RAM) or read-only memory included in the cell. Alternatively, the memory array can be centralized to control the switching devices in all of the analog cells 12. As a further alternative, external memory can be used if provision is made for routing the binary control signals to individual analog cells 12. As yet a further alternative, control over the switching devices may be directly provided by other digital circuitry instead of a memory array.

The absolute values of circuit elements in an analog cell 12 are not well controlled in integrated circuit fabrication processes. However, a high degree of matching accuracy can be attained if the elements are carefully laid out on the die. For this reason, circuit operations often are controlled using ratios of circuit elements. For example, the closed loop gain of an operational amplifier often is set by configuring a feedback path with matching resistors in a desired ratio.

Analog cell 12 includes operational amplifiers, comparators and other types of active circuits, and can include more than one active circuit of the same type. For example, a single cell can incorporate several amplifiers controlled by circuit elements such as capacitors and resistors to operate as an active filter.

In the figures, elements having the same reference number provide similar functions.

Figure 2:
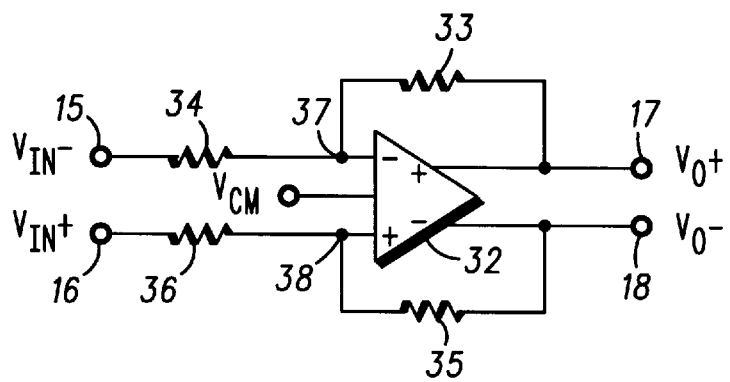
FIG. 2 is a block diagram of a programmable analog cell configured as an amplifier.

FIG. 2 is a schematic diagram of a programmable analog cell 12 including an operational amplifier 32 and resistors 33, 34, 35 and 36 in a closed loop amplifier configuration. Resistors 33–36 are interconnected with each other and with amplifier 32 with analog switching devices, which are not shown in order to simplify the figure. A differential input signal ($V_{IN+} - V_{IN-}$) is received across terminals 15 and 16 for producing a differential output signal ($V_{O+} - V_{O-}$) at terminals 17 and 18 as shown.

Amplifier 32 is a fully differential operational amplifier having an open loop gain of at least 30,000. The closed loop gain is set by the resistance ratios of resistor 33 to resistor 34 and of resistor 35 to resistor 36. For balanced operation, these ratios are typically set to be equal. To maintain a high degree of accuracy and frequency stability over a range of manufacturing and operating conditions, the closed loop gain typically is limited to a maximum of about thirty, providing an overall loop gain of 1,000. Hence, the closed loop gain $K=(V_{O+}-V_{O-})/(V_{IN+}-V_{IN-})$ is accurate to within 0.01%. As an example of closed loop gain computation, assume that resistors 33–36 have resistances of $R_{33}=R_{34}=R_{35}=R_{36}$, respectively. Then closed loop gain $K=R_{33}/R_{34}=R_{35}/R_{36}=1.0$, and $V_{IN+}-V_{IN-}=V_{O+}-V_{O-}$. It should be noted that the gain or other operating characteristics of amplifier 12 can also be set using capacitors or other passive components which can be clocked when appropriate to perform as functional equivalents of resistors 33–36.

Common-mode signal levels must be controlled to avoid unnecessarily limiting output voltage swings. For example, where $V_{DD}$=5.0 volts, symmetrical signals can reach their maximum amplitude when common-mode reference voltage $V_{CM}$=2.5 volts, so the signal swings between 0,0 and 5.0 volts, or 2.5±2.5 volts. However, if the signal reference is shifted to $V_{CM}$=3.0 volts, a symmetrical swing is limited to 3.0±2.0 volts, or a swing from 1.0 to 5.0 volts. Hence, the dynamic range is reduced from ±2.5 volts to ±2.0 volts.

Prior art amplifiers control the output common-mode voltage by sensing the potentials at the outputs of the amplifiers to generate a correction signal which is fed back to an input of the amplifier to adjust the common-mode potential. The feedback circuit typically includes a signal conditioning circuit such as an amplifier, level shifter, or filter. The additional circuitry reduces performance while increasing power consumption and die area.

In contrast, amplifier 32 incorporates the present invention to control common-mode levels by sensing a common-mode potential at inputs 37–38 to generate a compensation signal which is fed forward through amplifier 32 to output 17–18 as is more fully described below. As a result of sensing at the inputs rather than at the outputs, the extra signal processing circuits used in prior art amplifiers are not needed. Often, the feedforward circuit utilizes some or all of the same signal path used to amplify the differential signal. Therefore, power consumption and die area are reduced without reducing loop stability and operating speed. In effect, the present invention can perform the amplification or other signal processing functions of prior art systems by processing both the differential and common-mode signals through the same signal path within amplifier 32.

In operation, the common-mode input of amplifier 32 is biased to reference potential $V_{CM}$, which is set to equal the desired output common-mode level. Resistors 33–36 operate as voltage dividers between $V_{O+}$ and $V_{IN-}$ and between $V_{O-}$ and $V_{IN+}$ which develop common-mode components of $V_{O+}$ and $V_{O-}$ at inputs 37 and 38 for comparing with $V_{CM}$ to produce a common-mode correction signal. The correction through amplifier 32 interacts with resistors 33–36 to maintain inputs 37 and 38 at a virtual ground with respect to $V_{CM}$. That is, if $V_{O+}$ and $V_{O-}$ have a common mode component greater than $V_{CM}$, resistors 33–36 produce a negative feedback which increases the voltage on inputs 37 and 38. The voltage increase undergoes a negative amplification through amplifier 32 to restore $V_{O+}$ and $V_{O-}$ to the desired common-mode level equal to $V_{CM}$. A similar effect corrects for common-mode output levels which are lower than $V_{CM}$.

Figure 3:
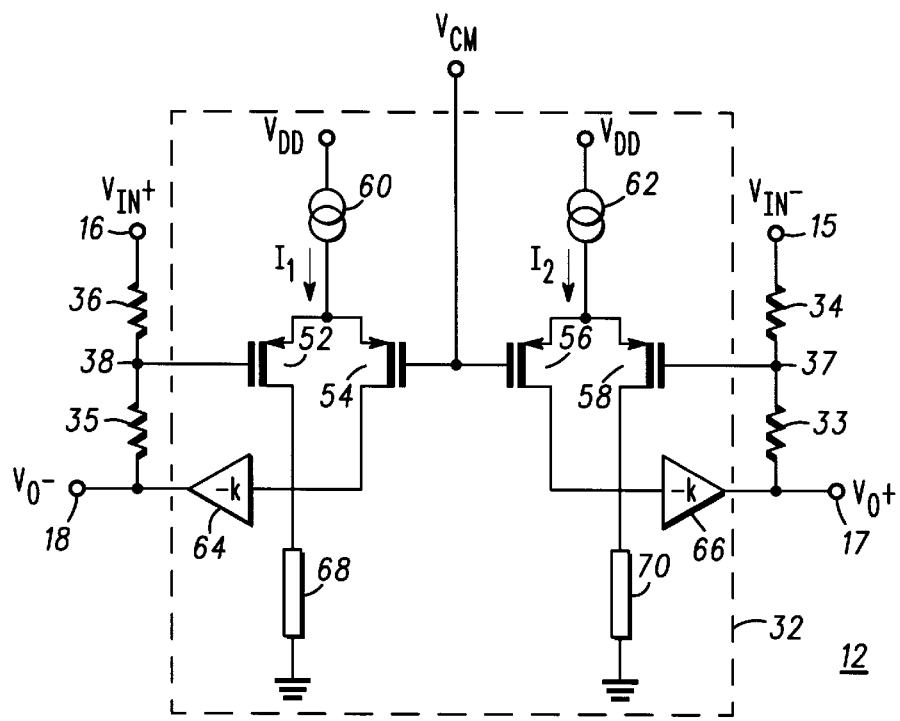
FIG. 3 is a schematic diagram of an amplifier.

FIG. 3 is a schematic diagram showing amplifier circuit 12 in greater detail. Resistors 33–36 have similar operation and values as the corresponding resistors shown in FIG. 2. Operational amplifier 32 includes transistors 52, 54, 56, and 58, current sources 60 and 62, load circuits 64 and 66, and balancing loads 68 and 70.

Those skilled in the art understand that transistors have a conduction path formed between first and second conduction electrodes which is modified with a control signal applied to a control electrode of the transistor. For example, in a metal-oxide-semiconductor transistor, the first and second conduction electrodes correspond to the drain and source electrodes of the transistor and the control electrode corresponds to the gate electrode. A channel is formed between the drain and source to provide the conduction path whose conduction is modulated or enabled in accordance with the magnitude of the control signal.

The principles underlying the operation of operational amplifier 32 can be seen by referring to a first portion that includes transistors 52 and 54, current source 60, load circuit 64, resistors 35–36 and balancing load 68. Assume that resistors 35 and 36 have equal resistances, that transistors 52 and 54 are matched, that $V_{DD}$=5.0 volts, and that initially $V_{IN+}$ is equal to $V_{CM}$=2.5 volts. Load circuit 64 is configured as a gain stage that converts the drain current of transistor 54 to output voltage $V_{O-}$. In the embodiment of FIG. 3, load circuit 64 comprises a transimpedance amplifier which has an inverting gain $K=-V_{O-}/I_{54}$. That is, the path through resistor 35 from $V_{O-}$ to $V_{IN+}$ is a negative feedback path. As an alternative embodiment, load circuit 64 could comprise a load resistor or constant current source. Load circuit 64 often includes an output buffer designed to drive a predetermined amount of load capacitance.

In the FIG. 3 embodiment, amplifier 12 is configured to operate as a unity gain amplifier. Hence, if no common-mode error is generated within operational amplifier 32, $V_{O-}=V_{CM}$=2.5 volts, the desired output common-mode level, and the common-mode component of $V_{O-}$ is zero. Resistors 35 and 36 produces a signal $V_{38}$ at input 38 by voltage dividing between $V_{IN+}$ and $V_{O-}$ to develop a potential $V_{38}$=2.5 volts on input 38. Therefore, the tail current $I_1$ supplied by current source 60 flows in equal portions $I_{52}=I_1/2$ and $I_{54}=I_1/2$ through transistors 52 and 54, respectively.

However, when a common-mode error is produced in operational amplifier 32 which increases the common-mode potential of $V_{O-}$ above 2.5 volts, resistors 35–36 develop a potential greater than 2.5 volts at input 38 such that $I_{52}<I_1/2$ flows through transistor 52 and $I_{54}>I_1/2$ flows through transistor 54. The increased $I_{54}$ flows to load circuit 64 to reduce the magnitude of $V_{O-}$, which forces potential $V_{38}$ developed on input 38 to virtually equal $V_{CM}$. Similarly, amplifier 12 forces input 38 to the potential of $V_{CM}$ to correct for a common-mode error when the common-mode component of $V_{O-}$ is less than $V_{CM}$. Balancing load 68 is configured to balance the load on the drain of transistor 52 with the drain load on transistor 54, so that load 68 matches the input impedance of load circuit 64. For example, if the input of load circuit 64 is configured as a diode-coupled transistor, then load 68 is configured as a matching diode-coupled transistor.

A second portion of operational amplifier 32 includes transistors 56 and 58, current source 62, load circuit 66, resistors 33–34 and balancing load 70 to operate in a similar fashion to the first portion but with opposite phasing. Current source 62 supplies a tail current $I_2$ to the common node of transistors 56 and 58 which, for balanced operation, typically is set equal to $I_1$. Input 37 functions as an inverting input with respect to output 17, so that $V_{O+}$ and $V_{IN-}$ are opposite in phase and an increase in $V_{IN-}$ results in a decrease in $V_{O+}$. Hence, resistors 33–34 form a negative feedback circuit that forces the potential on input 37 to be virtually equal to $V_{CM}$. Balancing load 70 is configured to load the drain of transistor 58 to balance the load of load circuit 66 on the drain of transistor 56.

It can be seen that transistors 52 and 58 effectively operate as a differential amplifier. Differential input signal $V_{IN+}-V_{IN-}$ is received across inputs 37 and 38 to generate a proportional differential current which is routed through load circuits 64 and 66 to produce differential output signal $V_{O+}-V_{O-}$ across outputs 17 and 18. Transistors 54 and 56 operate as a common-mode compensation circuit that responds to $V_{CM}$ and to the common-mode potentials developed at inputs 38 and 37 to feed common-mode compensation currents forward through load circuits 64 and 66 to produce correction signals at outputs 17 and 18.

An advantage of the present invention is that common-mode errors are sensed at the inputs and fed forward through operational amplifier 32, rather than sensed at the outputs and fed back through a signal conditioning circuit as is the case with the prior art. Many of the advantages of common-mode sensing at the input derive from feeding forward the compensation signals for routing through the same signal paths as differential input signal $V_{IN+}-V_{IN-}$, i.e., from the drains of transistors 54–56 through load circuits 64–66 and to outputs 17–18. The differential components of $V_{38}$ and $V_{37}$ are processed as differential signals of opposite polarity, whereas their common-mode components are processed as compensation signals having the same polarity. In other words, both differential and common-mode signals are processed through amplifier 32, so the extra common-mode feedback amplifiers of the prior art are not needed, which reduces die size and power consumption and improves the stability and performance of the analog cells 12.

In an alternate embodiment, the drains of transistors 54 and 56 are coupled through equivalent load resistors to the power supply conductor. The drains of transistors 52 and 58 are coupled through noninverting load circuits to nodes 17 and 18, respectively. All other components operate as described in FIG. 3.

Figure 4:
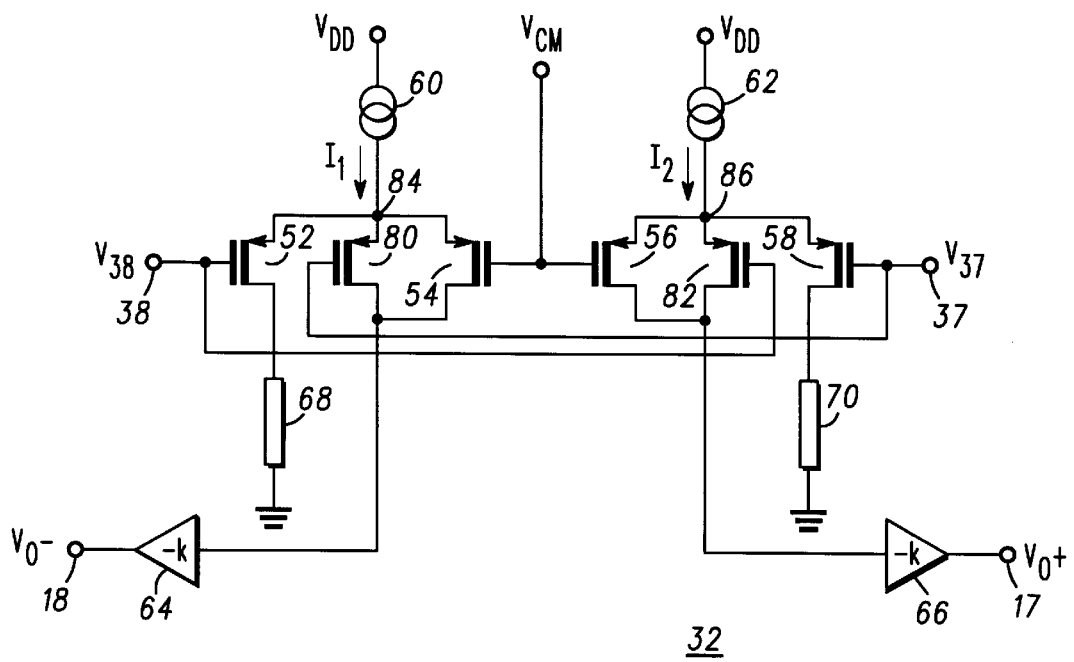
FIG. 4 is a schematic diagram of another amplifier.

FIG. 4 shows a detailed schematic of operational amplifier 32 in an alternate embodiment. Operational amplifier 32 receives a differential signal $V_{38}-V_{37}$ across inputs 38 and 37 and produces a differential output signal $V_{O-}-V_{O+}$ across outputs 18 and 17, respectively.

Amplifier 32 has first and second portions whose operation and elements are similar to those of the embodiment described in FIG. 3. However, transistor 80 is included in the first portion and transistor 82 is included in the second portion to increase the differential transconductance gain through transistors 52 and 80 and transistors 58 and 82. The source electrode of transistor 80 is coupled at common node 84 to the sources of transistors 52 and 54. Transistors 52 and 80 comprise a differential signal path which steers a proportional differential current from common node 84 to load circuit 64. The source electrode of transistor 82 is coupled at common node 86 to the sources of transistors 56 and 58. Transistors 58 and 82 comprise a differential signal path which steers a proportional differential current from common node 86 to load circuit 66. Common-mode compensation signals for each portion of amplifier 32 are fed forward through transistors 54 and 56 to load circuits 64 and 66.

Referring to the embodiment of FIG. 3, the complementary components of the differential signal are developed separately in each portion and provided at the differential outputs. To increase the transconductance, either the tail currents or the sizes of the input transistors must be increased. However, larger tail currents increase power consumption. Larger input transistors consume excessive die area because the transistor sizes must increase in proportion to the square of the desired transconductance increase. For example, to double the transconductance, transistors 52–54 must be quadrupled in size.

Turning back to FIG. 4, an alternate means of increasing transconductance is seen where transistor 80 is included in the first portion of amplifier 32. The transconductance increase is due to the operation of transistors 52 and 80 as a full differential amplifier that steers a differential current through transistor 80 that is responsive to both $V_{37}$ and $V_{38}$. The transconductance can be increased up to twice that of the FIG. 3 embodiment, as determined by the ratio of the sizes of transistor 80 to transistor 54. A higher ratio produces a larger transconductance increase and reduces common-mode correction. For example, as the ratio approaches zero, i.e., transistor 80 approaches a size of zero, the transconductance is substantially equivalent to the corresponding transconductance of the embodiment of FIG. 3. When the ratio approaches infinity, i.e., the size of transistor 54 approaches zero, the transconductance is twice that of the FIG. 3 embodiment.

Differential input signal $V_{37}-V_{38}$ is routed through a differential signal path that includes transistors 52 and 80. The common-mode compensation signal is fed forward through transistor 54 to merge with the differential signal at the input of load circuit 64. Hence, both the differential and common-mode signals are propagated through load circuit 64 to output 18.

The first differential stage is balanced to minimize internal offsets of amplifier 32 preferably by making transistor 52 equal in size to the sum of the sizes of transistors 54 and 80. In one embodiment, the size ratio of transistor 80 to transistor 54 is 3.0, which results in an increase in transconductance of approximately 88% over the FIG. 3 embodiment. A larger increase can be obtained by increasing the size ratio or by increasing the size of transistors 52, 54 and 80.

The second portion of amplifier 32 functions similarly to the first portion and includes transistor 82 for increasing the transconductance. Transistor 58 is configured to be equal in size to the sum of the sizes of transistors 56 and 82. The size ratio of transistor 82 to transistor 56 is set to be 3.0, which increases the transconductance of the stage by 88%.

Differential input signal $V_{37}-V_{38}$ is routed through a differential signal path that includes transistors 58 and 82. The common-mode compensation signal is fed forward through transistor 56 to merge with the differential signal at the input of load circuit 66. Hence, both the differential and common-mode signals are propagated through load circuit 66 to output 17.

By now it should be appreciated that the present invention provides a circuit and method of controlling the common-mode potential at the output of a fully differential amplifier by feeding forward a common-mode compensation signal through the amplifier. A common potential of the differential inputs is sensed and compared with a reference voltage equal to a desired common-mode level. The common potential is fed forward through the amplifier to produce the compensation signal to offset a common-mode voltage of the output of the amplifier. A feedback circuit comprising passive components develops the common potential from the common-mode component of the output signal. By sensing the common potential at the inputs and feeding forward the compensation signal through the amplifier, the present invention reduces the settling time of the amplifier while improving frequency stability and reducing die size and power consumption.

What is claimed is:

1. An amplifier, comprising:

a differential signal path having a common node coupled for receiving a tail current and first and second outputs to produce an output signal in response to first and second input signals;

a compensation circuit coupled between the common node and the first output and having a control input coupled for receiving a reference voltage, wherein the compensation circuit produces a common-mode compensation signal at the first output as a function of the reference voltage and a common potential of the first and second input signals; and a passive element coupled between the first output and a first input of the differential signal path to develop a common-mode component of the output signal as the common potential of the first input signal.

2. The amplifier of claim 1, wherein the first and second input signals steer a linear proportional current from the common node to a first node of the amplifier to produce the output signal.

3. The amplifier of claim 2, further comprising a first load circuit coupled to the first node for developing the output signal from the linear proportional current.

4. The amplifier of claim 3, wherein the control input of the compensation circuit steers a common-mode current to the first node to develop a common-mode compensation signal with the first load circuit.

5. The amplifier of claim 4, wherein the common-mode compensation signal reduces an error in a common-mode component of the output signal.

6. The amplifier of a claim 1, wherein the compensation circuit includes a first transistor having a control electrode coupled for receiving the reference voltage and a conduction path coupled from the common node to a first node of the amplifier.

7. The amplifier of claim 6, wherein the differential signal path includes:
   a second transistor having a control electrode coupled for receiving the first input signal, a first conduction electrode coupled to the common node and a second conduction electrode coupled to a second node of the amplifier; and
   a third transistor having a control electrode coupled for receiving the second input signal, a first conduction electrode coupled to the common node, and a second conduction electrode coupled to the first node.

8. The amplifier of claim 6, wherein the compensation circuit includes a fourth transistor having a control electrode biased to the reference voltage and a conduction path coupled between a second common node and a second node of the amplifier for developing a common-mode compensation signal.

9. The amplifier of claim 8, wherein the differential signal path further includes:
   a fifth transistor having a control electrode coupled for receiving the first input signal, a first conduction electrode coupled to the second common node for receiving a second tail current and a second conduction electrode coupled to the second node of the amplifier; and
   a sixth transistor having a control electrode coupled for receiving the second input signal, a first conduction electrode coupled to the second common node, and a second conduction electrode coupled to a third node of the amplifier.

10. The amplifier of claim 8, further comprising a second load circuit coupled to the second node for developing a complementary output signal at the second output of the differential signal path.

11. A method of amplifying, comprising the steps of:
   supplying a tail current to a common node;
   steering a differential current from the common node to first and second outputs to produce a differential output signal in response to a differential input signal;

applying a reference voltage to steer a compensation current from the common node to the first output; and
   comparing the reference voltage to a common potential of the differential input signal to produce the compensation current.

12. The method of claim 11, wherein the step of steering includes the step of routing the differential current through an impedance to develop the differential output signal.

13. The method of claim 12, wherein the step of applying including the step of
   routing the compensation current through the impedance to produce a common-mode compensation signal.

14. The method of claim 13, wherein the step of routing includes the step of reducing an error in a common-mode component of the differential output signal with the common-mode compensation signal.

15. An amplifier, comprising:
   a first transistor having a control electrode coupled to a first input of the amplifier for receiving a first differential input signal, a first conduction electrode coupled to a first common node for receiving a first tail current, and a second conduction electrode coupled to a power supply conductor;
   a second transistor having a control electrode coupled for receiving a reference signal, a first conduction electrode coupled to the first common node, and a second conduction electrode coupled to a first node for providing a first differential output signal;
   a third transistor having a control electrode coupled for receiving the reference signal, a first conduction electrode coupled to a second common node for receiving a second tail current, and a second conduction electrode coupled to a second node for providing a second differential output signal; and
   a fourth transistor having a control electrode coupled to a second input of the amplifier for receiving a second differential input signal, a first conduction electrode coupled to the second common node, and a second conduction electrode coupled to the power supply conductor.

16. The amplifier of claim 15, further comprising:
   a first resistor coupled between the first node and the control electrode of the first transistor;
   a second resistor coupled between the first input of the amplifier and the control electrode of the first transistor;
   third resistor coupled between the second node and the control electrode of the fourth transistor; and
   a fourth resistor coupled between the second input of the amplifier and the control electrode of the fourth transistor.

17. The amplifier of claim 16, further comprising:
   a first load circuit coupled between the first node and a first output of the amplifier for converting a first differential current to the first differential output signal; and
   a second load circuit coupled between the second node and a second output of the amplifier for converting a second differential current to the second differential output signal.

18. An integrated circuit, comprising a programmable analog array that includes a plurality of programmable analog cells interconnected by a programmable switching network, where a first programmable analog cell of the plurality of programmable analog cells includes an amplifier, comprising:

a differential signal path having a common node coupled for receiving a tail current and first and second outputs coupled to the programmable switching network to produce an output signal in response to first and second input signals; and a compensation circuit coupled between the common node and the first output, and having a control input coupled for receiving a reference voltage.

19. The integrated circuit of claim 17, wherein the compensation circuit produces a common-mode compensation signal at the first output as a function of the reference voltage and a common potential of the first and second input signals.

20. The integrated circuit of claim 18, wherein a first input of the differential signal path receives the first input signal from the programmable switching network, the first programmable analog cell further comprising a passive element coupled between the first output and the first input to develop a common-mode component of the output signal as the common potential of the first input signal.

21. An amplifier, comprising:

a first transistor having a control electrode coupled for receiving a reference voltage, a first conduction electrode coupled to a first common node of the amplifier for receiving a first tail current, and a second conduction electrode coupled to a first output of the amplifier; and a second transistor having a control electrode coupled for receiving the reference voltage, a first conduction electrode coupled to a second common node of the amplifier for receiving a second tail current, and a second conduction electrode coupled to a second output of the amplifier;

a third transistor having a control electrode coupled to a first input of the amplifier for receiving a first input signal, a first conduction electrode coupled to the first common node, and a second conduction electrode coupled to a power supply conductor; and a fourth transistor having a control electrode coupled to a second input of the amplifier for receiving a second input signal, a first conduction electrode coupled to the first common node, and a second conduction electrode coupled to the first output of the amplifier.

22. The amplifier of claim 21, further comprising:

a fifth transistor having a control electrode coupled for receiving the second input signal, a first conduction electrode coupled to the second common node; and a second conduction electrode coupled to the power supply conductor; and a sixth transistor having a control electrode coupled for receiving the first input signal, a first conduction electrode coupled to the second common node, and a second conduction electrode coupled to the second output of the amplifier.

23. The amplifier of claim 21, further comprising a passive element coupled between the first output of the amplifier and the first input of amplifier.

* * * * *